United States Patent [19]

Jasinski et al.

[11] Patent Number: 4,684,542

[45] Date of Patent: Aug. 4, 1987

[54] LOW PRESSURE CHEMICAL VAPOR DEPOSITION OF TUNGSTEN SILICIDE

[75] Inventors: Joseph M. Jasinski, Pleasantville; Bernard S. Meyerson, Yorktown Heights; Bruce A. Scott, Pleasantville, all of N.Y.

[73] Assignee: International Business Machines Corporation, Armonk, N.Y.

[21] Appl. No.: 895,119

[22] Filed: Aug. 11, 1986

[51] Int. Cl.⁴ ............................................ H01L 21/285
[52] U.S. Cl. .................................... 437/245; 427/91; 427/99; 427/255.2; 437/225
[58] Field of Search .................. 427/95, 91, 99, 255.2; 148/DIG. 147

[56] References Cited

U.S. PATENT DOCUMENTS

| | | | |
|---|---|---|---|
| 4,218,291 | 8/1980 | Fukuyama | 204/192 SP |
| 4,359,490 | 11/1982 | Lehrer | 427/95 |
| 4,501,769 | 2/1985 | Hieber | 427/95 |
| 4,504,521 | 3/1985 | Widmer | 427/95 |
| 4,565,157 | 1/1986 | Brors | 427/95 |
| 4,608,271 | 8/1986 | Hiebea | 427/95 |
| 4,629,635 | 12/1986 | Brors | 427/255.2 |

FOREIGN PATENT DOCUMENTS 58-7821  1/1983  Japan ................................ 427/95

OTHER PUBLICATIONS

Cooke, "A Review of LPCVD Metallization for Semiconductor Devices", Vacuum, vol. 35, No. 2, pp. 67-73, Feb. 1985.

Primary Examiner—John D. Smith
Attorney, Agent, or Firm—Jackson E. Stanland

[57] ABSTRACT

A process for preparing tungsten silicide films using low pressure, low temperature chemical vapor deposition to deposit silicon-rich tungsten silicide films. As a source of silicon, higher order silanes, such as disilane and trisilane, are used. The gaseous tungsten source is $WF_6$. The substrate temperature range is less than about 370° C., while the total pressure range is in the range 0.05–1 Torr. $WF_6$ flow rates are generally less than 25 sccm, while the higher order silane flow rates are generally less than about 400 sccm.

8 Claims, 7 Drawing Figures

LOW PRESSURE CHEMICAL VAPOR DEPOSITION OF TUNGSTEN SILICIDE

DESCRIPTION

1. Field of the Invention

This invention relates to low temperature, low pressure chemical vapor deposition techniques for the formation of silicon rich tungsten silicide using as a source of silicon higher order silanes, such as disilane ($Si_2H_6$) and trisilane ($Si_3H_8$).

2. Background Art

In the microelectronics industry, refractory metal silicide films are becomming increasingly more prevalent. For example, in MOSFET technology, these metal silicide films are used to reduce the polysilicon gate electrode resistance in the silicon gate technology by depositing the films over the underlying polysilicon layer. These metal silicide films possess high conductivity, the ability to withstand high processing temperatures, oxidizability for passivation, ease of patterning by dry etching techniques, compatibility with processing chemicals, and adequate adhesion and surface morphology. In particular, tungsten silicide is a very desirable material for use as a conducting layer in devices due to its low resistivity as well as its processing capability. This material has been used as a contact material as well as an interconnect material between devices on a circuit, and might in the future find a use as a metallic emitter.

The fabrication of refractory metal silicides has been developed over the years using many different processes. For example, the metal and silicon can be coevaporated at proper evaporation rates and subsequently subjected to high temperature annealing to form the metal silicides. There are difficulties with this technique, however, such as the lack of adhesion which often results between the overlying metal silicide layer and the underlying silicon layer. Some of these adhesion difficulties are caused by the lack of composition control during coevaporation. Further, this technique does not have adequate throughout capabilities for use in manufacturing lines.

Another technique for providing for metal silicide films is that shown in U.S. Pat. No. 4,218,291. In this reference, a transition metal target is sputtered to yield metal atoms while a silicon hydride, such as silane or disilane, is also present as a gas. The silicon hydride is decomposed by a plasma produced during sputtering in an inert gas atmosphere. The sputtered metal atoms react with the gaseous reactive species to produce the metal silicide in the gaseous state, which then deposits on the substrate. A subsequent heat treatment in a non-oxidizing atmosphere is used to reduce the resistivity of the metal silicide.

Plasma driven processes often lead to contaminated films, since whatever is in the plasma is often incorporated into the deposited film. Further, large amounts of hydrogen are often introduced into the silicide films, and pinholes can also be produced in these films. For these reasons, there is a tendency to try to avoid plasma processes when depositing silicon or metal silicides. This is particularly true when contacts are to be made to silicon surfaces by metal silicides, as the plasma can damage the silicon prior to formation of the metal silicides thereon.

Another technique used to form metal silicide films is low pressure chemical vapor deposition (LPCVD) as described in the following two references:

D. L. Brors et al "Solid State Technology", BP. 183–186, April 1983

K. C. Saraswat et al, IEEE Transactions on Electron Devices, Vol. ED-30, No. 11, pp. 1497–1505, November 1983.

In particular, tungsten silicide has been made by this technique, in which the source gases are silane and tungsten hexafluoride ($WF_6$). A commonly used apparatus for this process is the Genus Tool, provided by the Genus Corporation. This is essentially a cold wall/hot susceptor reactor in which these species are pyrolyzed under LPCVD conditions $P=200$ mTorr, and $T=425°$ C. The gas flows used in this apparatus are about 20 sccm (Standard Cubic Centimeters, a known mass quantity at known temperatures and pressures) $WF_6$ and 1000 sccm $SiH_4$. The stoichiometry of the as-deposited tungsten silicide is required to be in the range of $WSi_{2.2-2.5}$, Si rich compared to the desired $WSi_2$ phase that is achieved after annealing of the as-deposited film. This is required to avoid the formation of voids and cracks when the silicide is annealed, as well as to avoid delamination of the layer.

The incorporation of silicon from the silane source is highly inefficient as is apparent from the very high flow rate required for silane in this process. These high flow rates lead to significant hazards associated with the process, since silane can be explosive and dangerous. Further, disposing of large volumes of silane can create a major safety hazard, since conventional scrubbers that neutralize $WF_6$ do not always dissociate the silane gas. This effluent, if neither adequately diluted or reacted to products, will burn or explode on contact with air. Further, inefficient source utilization results in high costs due to large silane consumption.

From a processing point of view there are other problems associated with this CVD process. Ideally, in a two component CVD process, it is desirable to adjust the stoichiometry of the resulting films by adjusting the ratios of the input gases. However, this process operates in a temperature regime where the silane gas is quite stable, and does not decompose to form a film on its own. The presence of $WF_6$ is required for silane decomposition to occur. Thus, although film growth rates vary linearly in $WF_6$ gas input, they are essentially independent of $SiH_4$. This makes it difficult to adjust the film stoichiometry, since a change in $WF_6$ input alters both the silicon and tungsten growth rate, while a change in silane input has little or no effect.

In order to overcome these problems, it has been discovered that higher order silanes, such as disilanes and trisilanes, can be used in low pressure CVD processes in a manner to provide films without defect contamination and without the attendant safety problems. Less stringent requirements are placed on the pumps used in the apparatus and less contaminants are introduced into the deposited films. Further, the possibility of gas phase nucleation is reduced.

The use of higher order silanes has not been taught or suggested by the prior art for the formation of metal silicides, and specifically for the formation of tungsten silicide in a thermally driven CVD apparatus. It is acknowledged that, however, in other plasma driven or laser driven processes, both silane and disilane have been used. For example, reference is made to U.S. Pat. Nos. 4,363,828 and 4,495,218. In these references, metal silicides are not formed, it being the intent of these references to form amorphous silicon or insulating films. When plasmas or laser light are used to dissociate source gases, the large amount of available power enables one to use different types of source gases. For example, silane or disilane can be used, since the energy inputs in plasma or laser driven systems are very high, being several orders of magnitude (approximately 200×) larger than those found in thermal CVD systems. Thus, in plasma or laser driven systems, the input energy is tuned to the source gas in order to decompose the source gas. In contrast with this, however, the energy available from thermal CVD systems is so small that the choice of source gas is not as extensive. As an example, U.S. Pat. Nos. 4,283,439 and 4,359,490 describe the formation of metal silicide films using only silane gas CVD processes.

In the temperature and pressure ranges used in the present invention, disilane will not decompose by itself to grow a tungsten silicide film. Some type of cooperative phenomenon is present wherein the presence of $WF_6$ causes a cooperative interaction between $WF_6$ and disilane at the gas/substrate interface in order to produce the metal silicide film. Thus, absent this knowledge there is no reason to be led to use a higher order silane.

Still further, disilane would normally be considered to nucleate more rapidly in the gas phase than would silane. The presence of gas phase nucleation in low pressure CVD processes is harmful, resulting in the production of pinholes and defects in the deposited film. However, the applicants have discovered that the likelihood of gas phase nucleation is greater when silane is used than when disilane is used, probably because the significantly reduced gas flows for disilane mean that significantly reduced quantities of disilane are required in comparison with silane. Thus, although one would be lead away from using disilane or another higher order silane in this process, applicants have discovered that in fact the likelihood of gas phase nucleation is reduced when disilane or trisilane is used in place of silane.

Since the disilane flow rates can be so significantly reduced with respect to the silane flow rates, while still providing silicon-rich as-deposited films, the complexity of the processing equipment is significantly reduced. Further, the likelihood of carrying contaminants in a very large gas flow is also reduced, and the tungsten silicide films deposited by this technique are superior to those deposited when silane is used as a silicon source. This also is a safer process, since the amount of disilane that is present is so significantly reduced. The cooperative effect between $WF_6$ and the higher order silane appears to be enhanced, leading to silicon-rich tungsten silicide films without the necessity for very high disilane gas flows.

Accordingly, it is a primary object of this invention to provide an improved LPCVD process for producing tungsten silicide films.

It is another object of this invention to provide LPCVD processes for producing tungsten silicide films at low pressures and temperatures using higher order silanes.

It is another object of this invention to provide an improved process for forming tungsten silicide, which process has increased safety.

It is another object of this invention to provide a low pressure CVD process for producing tungsten silicide films in which the film quality is superior to that used by previously known techniques.

BRIEF SUMMARY OF THE INVENTION

In the practice of this invention, a low pressure thermally and chemically driven CVD process is used to form either tungsten silicide, using higher order silanes $WF_6$ and source gases. The as-deposited tungsten silicide films are silicon-rich, the stoichiometry being in a range of $W Si_{2.2-2.5}$.

The reactor system is a low pressure, low temperature, cold wall system in which the source gases (disilane or trisilane and tungsten hexafluoride) are introduced into a chamber. These gases react in the chamber and deposit a uniformly thick tungsten silicide film on the substrate. The source gases are injected toward the susceptor at ambient temperature. Due to the low total pressures, little or no heating of the gas sources occurs prior to impact at the substrate on the heated susceptor. The heterogeneous (gas/susceptor interface) reactions lead to film formation.

These and other objects, features, and advantages will be apparent from the following more particular description of the preferred embodiments.

DETAILED DESCRIPTION OF THE PREFERRED EMBODIMENTS

In the process of this invention, low pressure CVD is used to deposit tungsten silicide films which are silicon-rich in an as-deposited state. As a source gas of silicon, a higher order silane is used, such as disilane or trisilane.

In this invention, a cold wall/hot susceptor reactor system is used, where the source of W is $WF_6$. The silicon source is generally either disilane ($Si_2H_6$) or trisilane ($Si_3H_8$). Even higher order silanes can be used but the advantage over disilane and trisilane is minimal. The total pressure in the system is in the range of about 0.05–1 Torr, while the susceptor temperature is in the range of approximately room temperature to less than 400° C. A preferred susceptor temperature is 200°–300° C. and a preferred pressure range is 50–500 mTorr. The flow rate of $WF_6$ is less than about 25 sccm, while the flow rate of the higher order silane is generally less than about 500 sccm. $WF_6$ flow rates of about 5–15 sccm are preferred, while the preferred flow rate for $Si_2H_6$ is 100–200 sccm. The preferred flow rate of Si₃H₈ is 50–150 sccm.

Figure 1:
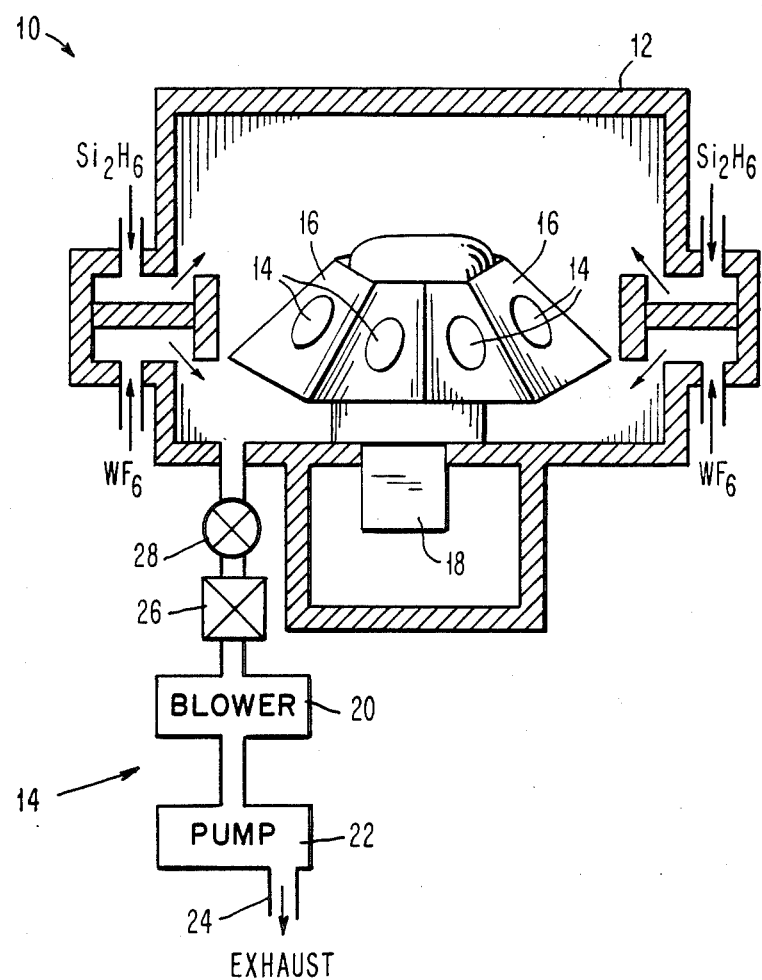
FIG. 1 is a schematic diagram of an apparatus suitable for carrying out the present invention.

An apparatus for carrying out the present invention is shown in FIG. 1. This is a schematic of the apparatus sold by Genus Inc. as the Genus 8301 System. It is a low pressure, low temperature, cold wall, chemical vapor deposition system particularly designed for the deposition of tungsten silicide films on substrates such as silicon or doped silicon wafers. This system consists of two cabinets, a process cabinet schematically shown in FIG. 1, and an electronics cabinet, (not shown), and an RF generator and remotely located vane pump/oil filtration assembly.

Referring in more detail now to FIG. 1, the process cabinet 10 consists of the process chamber 12, a pumping system, a gas distribution system, a substrate/turret heater assembly, an automatic wafer handling assembly, a differential seal pump, blower, and control electronics. Wafers 14 are loaded in the process chamber 12 by an automatically operated arm. The wafers 14 are mounted on the turret 16 which rotates at one revolution per minute. Turret 16 is heated by quartz lamps, there being an infrared sensor assembly 18 for sensing the turret temperature. The gases—disilane, trisilane, etc. and tungsten hexafluoride WF₆, react in process chamber 12 and deposit uniform tungsten silicide films on the wafers 14. This system can achieve a base pressure of less than 10 mT with the help of a blower 20 and a vane pump 22. Blower 20 and pump 22 are connected between the exhause port 24 and the process chamber 12, being connected to the funnel valve 26 and a high vacuum valve 28.

A differential seal pump maintains the vacuum integrity between the atmosphere and the inner chamber pressure. Water cooling is used to keep the chamber walls cold. The cold walls prevent gas phase nucleation and deposition on the walls, and thus allow the thermally driven deposition to take place on only the surface of the wafers 14. A RF generator (not shown) is used to clean the process chamber 12, using a NF₃ plasma.

The system can be automatically or manually operated using the controls of the aforementioned cabinet. The control module of the cabinet consists of a touch panel CRT and a floppy disk drive, and communicates with the user via menu-driven displays. Software programs containing the process information such as temperature, pressure, and gas flows are the process recipes provided by the manufacturer. These recipes are stored on a disk. In the automode, the system loads the wafer, processes and unloads without any break in the operation while, in the manual mode, loading, process and unload operations can be individually carried out.

In the following discussion, the gaseous silicon source is disilane (Si₂H₆), while the metal source is tungsten hexaflouride (WF₆). These gases form a stable mixture at ambient temperature and no spontaneous reaction occurs. The possible hetergeneous (gas/susceptor interface) reactions that lead to tungsten silicide film formation are as follows:

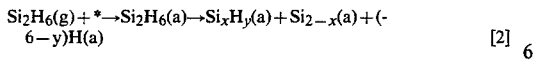

The asterisk (*) used in these equations refers to active adsorption sites where gases can stick to the surface of the wafers 14. The designation (a) refers to adsorbed species while the designation (g) refers to a gaseous species. Reaction 1 has been observed by Auger (AES) and Photoemission Spectroscopy (PES), where WF₆ was seen in UHV to adsorb on the bare Si (100) wafer, and then transfer its fluorine onto the silicon surface after this initial step. The necessity for the presence of active (bare) adsorption sites has been established, as the WF₆ adsorption process is self passivating when full surface coverage by W and F is attained. Beyond this initial step in the growth process, the remainder of the mechanism is somewhat speculative, as both the kinetic rate data and the details of silane surface decomposition pathways are known. Thus, several different explanations may be invoked to explain the enhanced incorporation of silicon from disilane in the present process.

From the frame work of the reactions (1)–(4), it is expected that enhanced Si incorporation will result if the adsorption/dissociation reaction (2) for the silicon bearing species is enhanced for the case of disilane versus silane. Alternatively, the unspecified fragments produced upon the disassociative adsorption of disilane on the hot substrate may more efficiently remove flourine and hydrogen from the surface, enhancing the availability of free adsorption site for further film formation to take place. Arriving at a unique model as to the Si incorporation enhancement mechanism requires a more detailed investigation based upon a study of the surface reaction kinetics of this complex system. Apart from considering heterogeneous chemistry, homogeneous (gas phase) chemistry can participate in this process, dependent upon the exact nature of the species ejected from the reaction surface. Prediction of exactly what rate controlling silicon incorporation step has been directly enhanced by the use of disilane was not fully determined.

As will be seen further with reference to FIGS. 2–5, even at the lowest disilane flows that could be maintained, the resulting tungsten silicide films were still silicon-rich. When it was attempted to lower disilane flows below 200 sccm, a significant reduction in film deposition rates occurred. In order to further reduce disilane flows and still maintain adequate growth rates, the injection of hydrogen can be employed. This will enhance the tungsten component of the film content by directly enhancing deposition of tungsten via the hydrogen reduction of the WF₆ source. As this growth chemistry is a cooperative phenomena, where no deposition is seen if either one of the reactants is absent, accelerating the pyrolysis of WF₆ by the addition of hydrogen may in fact enhance disilane pyrolysis as well.

Another advantage of the use of disilane is its lower vapor pressure relative to silane, approximately 30 psig. at ambient temperature, which means that the mass quantity and tank pressure for the storage of disilane are not related. Also, the low delivery pressure of disilane, though more than adequate for use with standard flow control devices, is sufficiently low that special high pressure valving is not required, even in large gram quantity installations. The order ot magnitude reduction of gram quantity requirements for the present process using disilane rather than silane will considerably ease the hazards associated with disilane. Further, films have been grown which are rich in silicon even at minimum disilane flows.

FIGS. 2–7 relate to the deposition of tungsten silicide films and in particular show the effects of varying parameters such as disilane flow rate, WF$_6$ flow rate, substrate temperature, deposition temperature, silane flow rate, and the Si/W ratio. These parameters have been varied to study the growth rate, the as-deposited resistivity, the Si/W ratio, and the annealed resistivity of tungsten silicide films. From this data, it is apparent that the deposition temperature and WF$_6$ flow are the critical parameters in determining film properties, while other factors weigh far less heavily. To evaluate the quality of disilane prepared samples, based on the data in some of these figures, a standard set of growth conditions was selected, which will be indicated for each of these figures.

Figure 2:
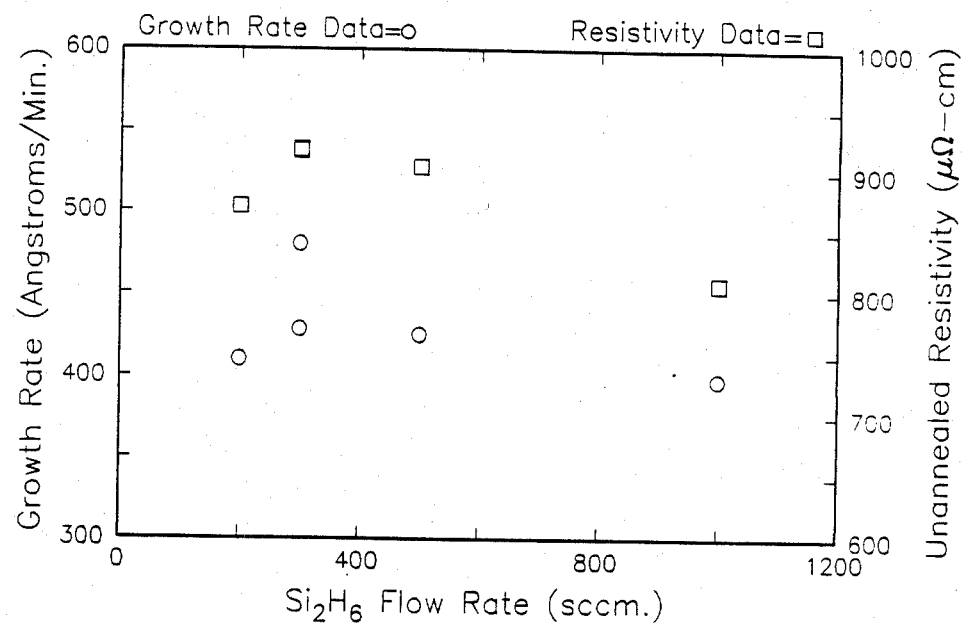
FIG. 2 is a plot of growth rate and unannealed film resistivity versus disilane flow rate for the deposition of tungsten silicide films by the present invention.

In FIG. 2, the growth rate and resistivity of as-deposited samples of tungsten silicide are plotted against the disilane flow rate. The standard conditions are P=200 mTorr, WF$_6$ flow rate=10 sccm, and T=360° C. While there is some change in growth rate and unannealed resistivity, the effect of disilane flow rate is not greatly significant.

Figure 3:
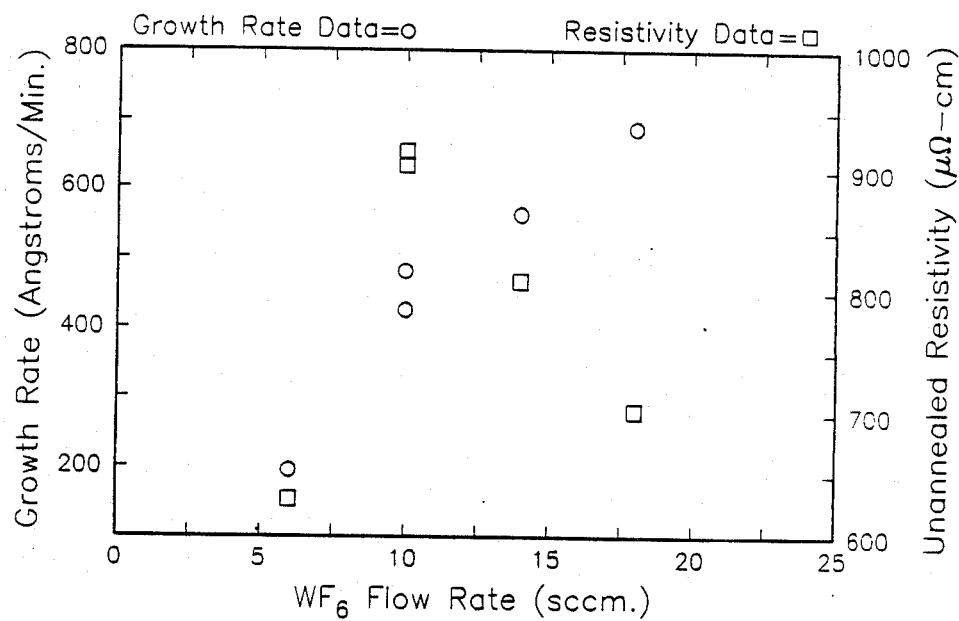
FIG. 3 is a plot of growth rate and unannealed film resistivity versus $WF_6$ flow rate for the deposition of tungsten silicide films.

In FIG. 3, the growth rate and unannealed resistivity of tungsten silicide films are plotted against the WF$_6$ flow rate. As is apparent, this flow rate has a more significant effect on the growth rate and the as-deposited film resistivity. As the WF$_6$ flow rate increases, the growth rate increases while the resistivity decreases. In this data, the disilane flow rate was 210 sccm., while the pressure and substrate temperature were 200 mTorr and 300° C., respectively.

Figure 4:
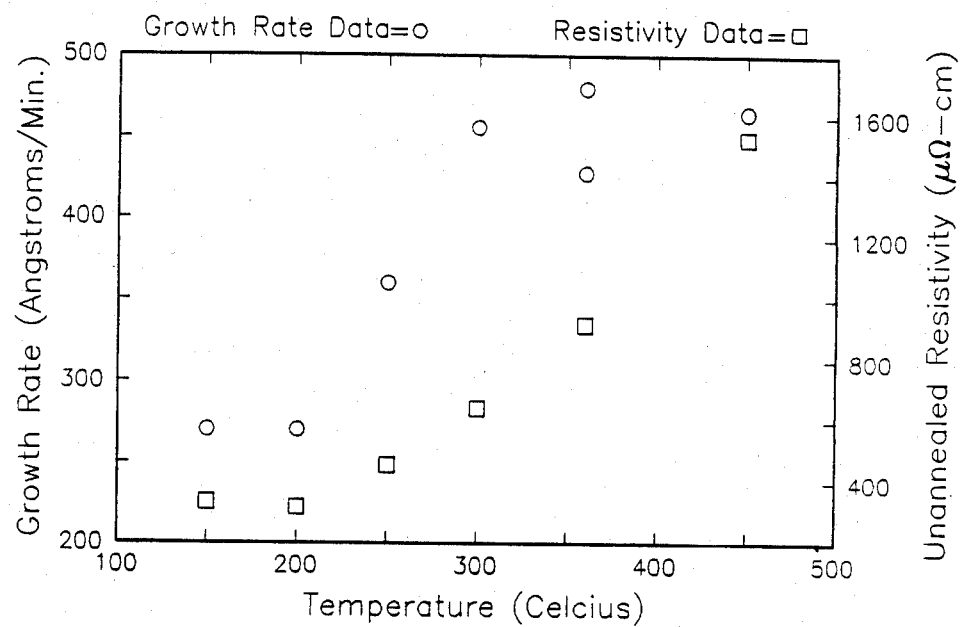
FIG. 4 is a plot of growth rate and unannealed film resistivity versus substrate temperature for the deposition of tungsten silicide films.

FIG. 4 plots the growth rate and unannealed resistivity of tungsten silicide films versus substrate temperature, for P=200 mTorr, disilane flow rate=210 sccm., and WF$_6$ flow rate=10 sccm. As is apparent, as the substrate temperature increases, the growth rate increases as does the as-deposited resistivity. As mentioned previously, the substrate temperature is a more critical parameter affecting growth rate and film properties.

Figure 5:
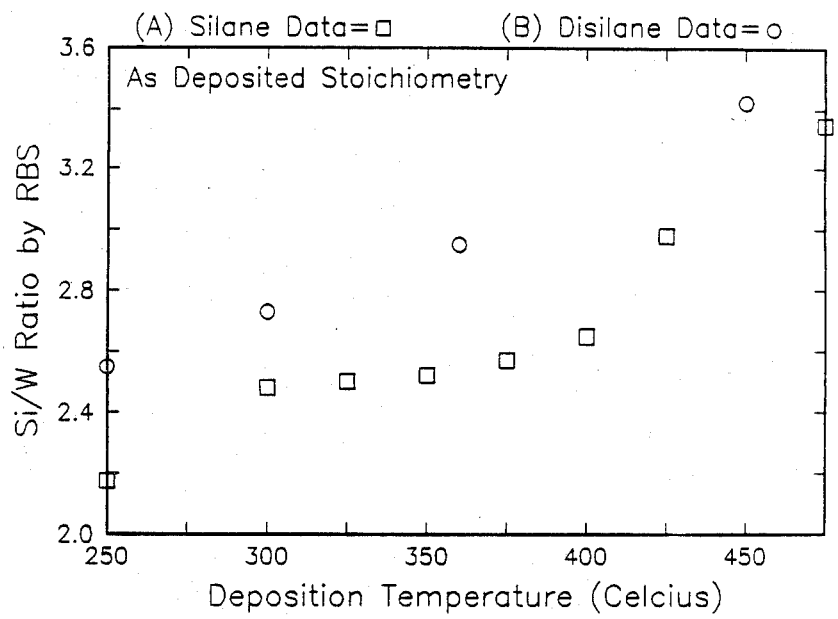
FIG. 5 is a plot of comparative stoichiometry data (Si/W ratio) for tungsten silicide films produced from silane (dataset A) and from disilane (dataset B).

FIG. 5 plots the Si/W ratio as determined by Rutherford backscattering (RBS) as a function of deposition temperature for both silane and disilane. Dataset A is for films produced using silane where the SiH$_4$ flow rate is 1000 sccm., while dataset B is for films produced using disilane flowing at a rate of 210 sccm. Although silane flows in this experiment exceeded disilane flows by a factor of approximately 5, disilane process samples were consistently silicon-rich compared to silane process samples. If a common substrate temperature 360° C. is chosen, using the data for W/Si stoichiometry versus silane flow as shown in FIG. 6, in excess of 2.0 liters/minute silane flow would be required to achieve the as-deposited silicon content (Si/W=2.95) that is reached using only 0.21 liters/min. disilane.

Figure 6:
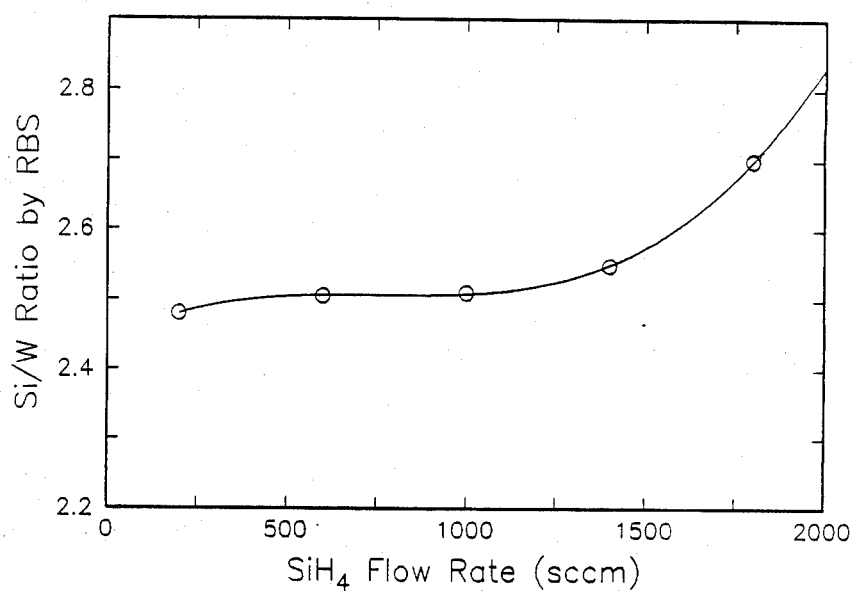
FIG. 6 is a plot of film stoichiometry (Si/W ratio) as a function of silane flow for tungsten silicide films deposited by a CVD process.

FIG. 6 is a plot of Si/W ratio as determined by RBS, as a function of disilane flow rate for conditions P=200 mTorr, WF$_6$ flow rate=10 sccm., and the substrate temperature=360° C. As is apparent, very high flow rates of silane are required to begin to increase the Si/W ratio by significant amounts.

Figure 7:
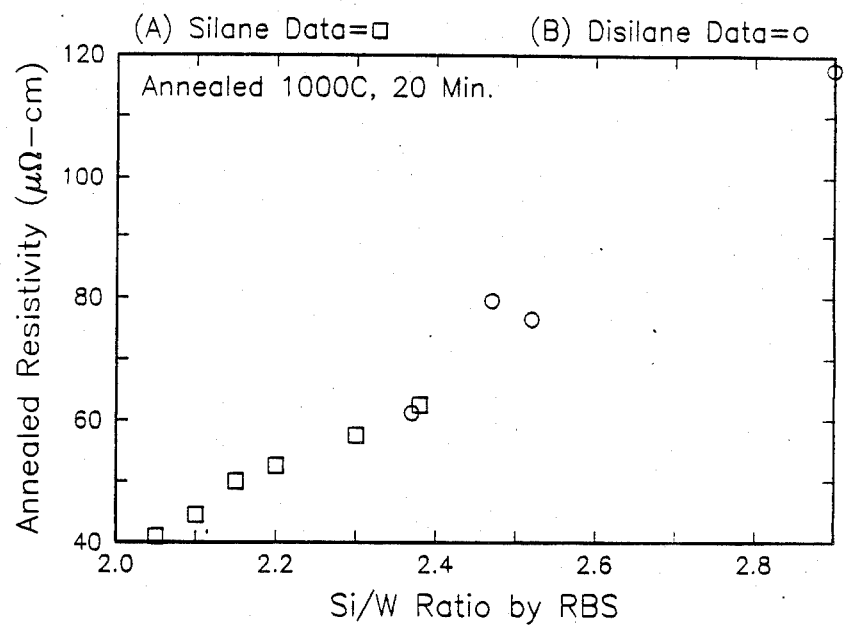
FIG. 7 is a plot of annealed film resistivity versus film stoichiometry (Si/W ratio) for tungsten silicide films deposited using silane (dataset A) and disilane (dataset B).

FIG. 7 plots the tungsten silicide resistivity of annealed samples as a function of film stoichiometry (Si/W ratio) as determined by RBS. Samples were prepared using both silane (dataset A) and disilane (dataset B). When plotted on the same axis, films of like stoichiometry, whether prepared from silane or disilane, show essentially the same resistivities. Thus, the source of silicon content can be changed, and only the final film stoichiometry determines film properties. Upon examination by cross-sectional transmission electron microscopy (TEM) both sets of films were found to be conformal, with vertical side wall coverage 80% that of the base when deposited over a 3000 angstrom high oxide step. X-ray data from the annealed disilane produced film showed there to be the expected WSi$_2$ phase upon annealing, while prior to annealing no x-ray structure was observed. Resistivity mapping of the samples showed a typical sample uniformity (3σ) of better than ±2% within the sample.

Thus, disilane can be used as a source of silicon in a low pressure, low temperature CVD process for depositing tungsten silicide. Films prepared by this technique have properties comparable to those prepared from a silane source, but with an order of magnitude reduction in silicon source flow requirements in order to achieve films of comparable silicon content. Additionally, the present process produces films of the correct stoichiometry, resistivity, uniformity and grain structure at temperatures of only 250° C., well below the growth temperature required by conventional silane-based processing where the temperature is greater than 370° C. Further silicon source flow reduction may be possible by the use of hydrogen injection, as mentioned previously.

What has been described is a new process for producing tungsten silicide in a silicon-rich as-deposited state. This process is a low temperature, low pressure CVD process in which the source of silicon is disilane, trisilane, or an even higher order silane. The flow rates of these higher order silanes are significantly less than the flow rates of silane used in prior CVD processes. There is a cooperative phenomenon that occurs between the metal source gas and the higher order silane at these temperatures and pressures since, without both gas sources being present, no deposition will occur on the substrate in this cold wall, hot substrate apparatus. As another feature, the present process produces films of the correct stoichiometry, resistivity, uniformity, and grain structure at temperatures of only about 250° C., which is well below the growth temperature required by conventional silane-based processing where the substrate temperature is greater than about 370° C.

Although the invention has been described with respect to specific embodiments thereof, it will be apparent to those of skill in the art that variations may be made therein without departing from the spirit and scope of the present invention. However, the specific ranges of temperature and pressure are restricted to the ranges cited herein, while the higher order silane flow and metal source gas flow can be varied somewhat.

Having thus described our invention, what we claim as new and desire to secure by Letters Patent is:

1. A method for depositing silicon-rich tungsten silicide films on a substrate, said method including the steps of:

introducing WF$_6$ gas and a higher order silane gas given by the formula $$Si_nH_{2n+2},$$

where n=2, 3, . . . into a cold wall, hot susceptor CVD reactor with the substrate located on said susceptor, establishing a substrate temperature less than about 370° C. and a total system pressure less than 1 Torr, the flow rate of said WF$_6$ being less than about 25 sccm while the flow rate of said higher order silane is less than about 500 sccm, and reacting said higher order silane and said $WF_6$ at said substrate to deposit a silicon-rich film of tungsten silicide on said substrate.

2. The method of claim 1, where said substrate temperature is in the range of about 200°–300° C., said higher order silane flow is less than 400 sccm, and said total pressures is in the range 50–500 mTorr.

3. The method of claim 1, where substrate is comprised of silicon.

4. The method of claim 1, including the further step of annealing said silicon-rich tungsten silicide film to crystallize said film to $WSi_2$.

5. The method of claim 1, where said higher order silane is $Si_2H_6$.

6. A method for the formation of $WSi_2$ on a substrate including a semiconductor device, including the steps of:

placing said substrate in a cold wall, hot susceptor CVD apparatus, introducing $WF_6$ gas and a higher order silane gas into said apparatus, said higher order silane gas being given by the formula $$Si_nH_{2n+2}$$

where n=2, 3, . . . , establishing a substrate temperature in the range of about 200°–300° C. and a total system pressure less than about 500 mTorr, the flow rate of said $WF_6$ being less than about 25 sccm and the flow rate of said higher order silane being less than about 400 sccm, reacting said higher order silane and said $WF_6$ at said substrate to deposit a silicon-rich tungsten silicide film thereon, and annealing said tungsten silicide film to crystallize said film to $WSi_2$.

7. The method of claim 6, where said substrate is comprised of Si.

8. The method of claim 7, where said higher order silane is $Si_2H_6$.

* * * * *